United States Patent
Drasny et al.

(10) Patent No.: US 8,140,313 B2
(45) Date of Patent: Mar. 20, 2012

(54) TECHNIQUES FOR MODELING VARIABLES IN SUBPROGRAMS OF HARDWARE DESCRIPTION LANGUAGE PROGRAMS

(75) Inventors: Gabor Drasny, Poughkeepsie, NY (US); Ali S. El-Zein, Austin, TX (US); Wolfgang Roesner, Austin, TX (US); Fadi A. Zaraket, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1086 days.

(21) Appl. No.: 12/022,309

(22) Filed: Jan. 30, 2008

(65) Prior Publication Data

US 2009/0193390 A1 Jul. 30, 2009

(51) Int. Cl.
*G06F 17/50* (2006.01)
(52) U.S. Cl. .............. 703/14; 703/22; 717/104
(58) Field of Classification Search .......... 703/14, 703/22; 717/104
See application file for complete search history.

(56) References Cited

U.S. PATENT DOCUMENTS

| | | | |
|---|---|---|---|
| 5,923,608 A | 7/1999 | Payne | |
| 5,930,148 A | 7/1999 | Bjorksten et al. | |
| 5,946,472 A | 8/1999 | Graves et al. | |
| 6,263,301 B1 * | 7/2001 | Cox et al. | 703/14 |
| 7,086,030 B1 | 8/2006 | Stroomer et al. | |
| 7,769,569 B2 * | 8/2010 | Stern | 703/2 |
| 2003/0033588 A1 * | 2/2003 | Alexander | 717/107 |
| 2003/0074177 A1 * | 4/2003 | Bowen | 703/22 |
| 2003/0105620 A1 * | 6/2003 | Bowen | 703/22 |
| 2003/0149962 A1 * | 8/2003 | Willis et al. | 717/135 |
| 2004/0088691 A1 * | 5/2004 | Hammes et al. | 717/158 |
| 2004/0163072 A1 | 8/2004 | Levy | |
| 2005/0229143 A1 | 10/2005 | Gehman et al. | |
| 2006/0089827 A1 * | 4/2006 | Gabele et al. | 703/17 |
| 2006/0190871 A1 | 8/2006 | Likovich, Jr. et al. | |
| 2008/0147372 A1 * | 6/2008 | Paulsen | 703/14 |

FOREIGN PATENT DOCUMENTS

EP 1297456 4/2003

OTHER PUBLICATIONS

Childs et al., Shared Variable Support Using Optimistic Execution, TDB v38 n11 Nov. 1995 p. 131-136, Rochester.

\* cited by examiner

*Primary Examiner* — Russell Frejd
(74) *Attorney, Agent, or Firm* — Yudell Isidore Ng Russell PLLC

(57) ABSTRACT

A method, system and computer program product for modeling variables in subprograms of a HDL program. A subprogram is provided with an initial value of a variable of an element being modeled and the subprogram is stored in memory of a data processing system. In response to a subprogram call, a copy of the stored subprogram is provided to the requesting HDL program. During execution, the initial value of the variable in the provided copy of the subprogram may be modified by the HDL program, but the value retains unchanged in the stored subprogram.

12 Claims, 3 Drawing Sheets

TECHNIQUES FOR MODELING VARIABLES IN SUBPROGRAMS OF HARDWARE DESCRIPTION LANGUAGE PROGRAMS

BACKGROUND

1. Technical Field

The present invention generally relates to computer systems and in particular to techniques for modeling variables in subprograms of Hardware Description Language programs executed in computer systems.

2. Description of the Related Art

A Hardware Description Language (HDL) is generally used in simulation programs for modeling the temporal behaviour and/or spatial circuit structure of electronic devices and systems. Syntax and semantics of HDL programs (i.e., programs written in HDL) include notations for expressing time and concurrency, which are the primary attributes of the electronic hardware.

A HDL program is designed to implement the underlying semantics of the language statements and provides hardware designers with the ability to model a piece of electronic hardware before the hardware is implemented physically. Commonly used HDLs are VHDL developed for modeling field-programmable arrays (FPAs) and application-specific circuits (ASICs) and the Verilog, which is mostly used for modeling electronic systems.

Both VHDL and Verilog support subprograms used for describing reusable portions of the designs being simulated. However, present semantics of the subprograms does not allow a designer to infer, during execution of a respective subprogram, the content of memory associated with values of variables used in the subprogram. Such drawbacks of these HDLs limit the subprograms to description of computational logic devices and do not allow simulation of sequential circuits.

SUMMARY OF ILLUSTRATIVE EMBODIMENTS

Disclosed are a method, system and computer program product for modeling variables in subprograms of HDL programs.

In embodiments of the present invention, a subprogram is provided with an initial value of a variable of an element being modeled. The subprogram is stored in memory of a data processing system. In response to a subprogram call, a copy of the stored subprogram is provided to the requesting HDL program. During execution, the initial value of the variable in the provided copy of the subprogram may be modified by the HDL program, but retains unchanged in the stored subprogram.

The above as well as additional features and advantages of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
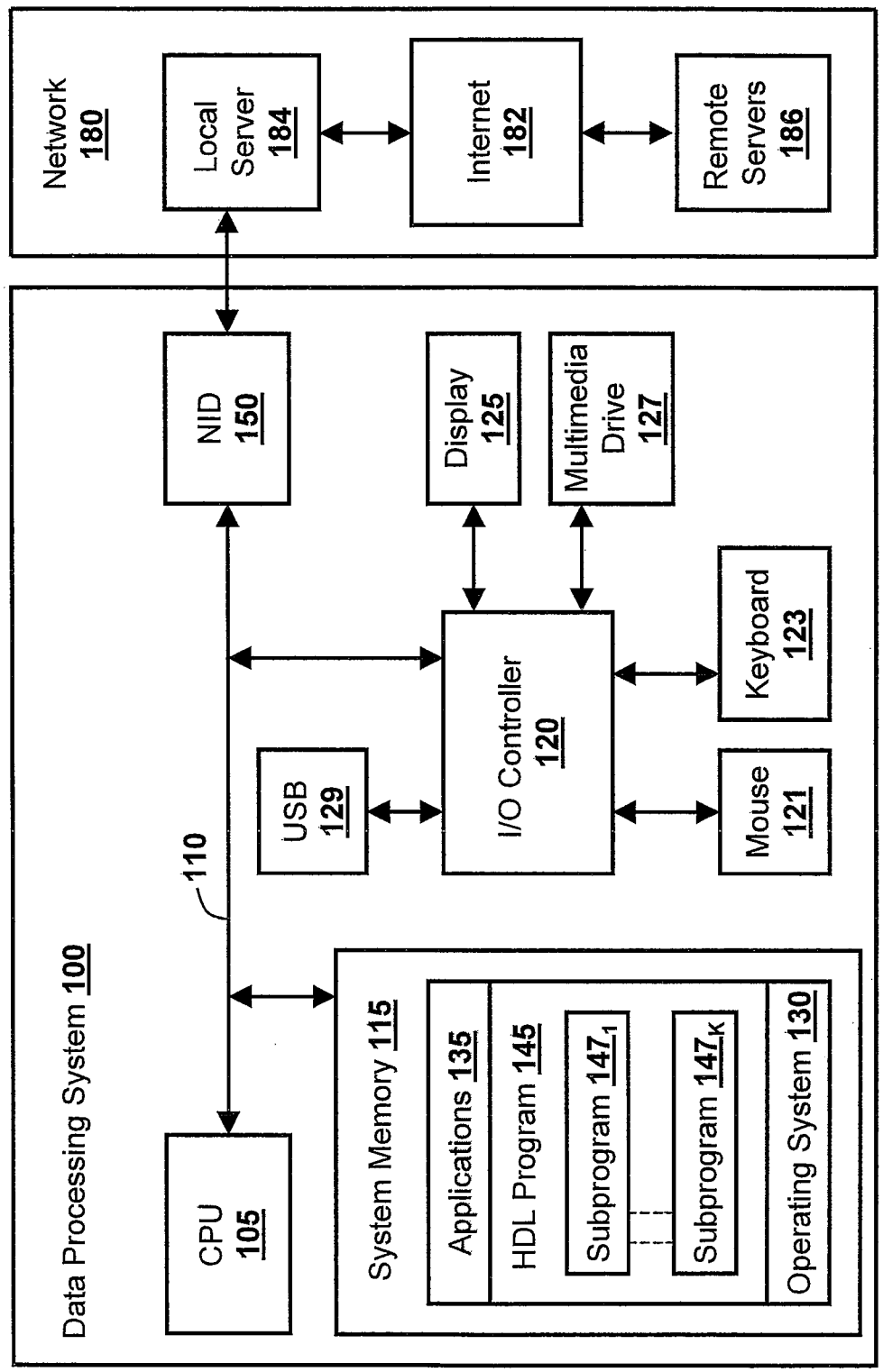
FIG. 1 is a block diagram of a data processing system configured with hardware and software components for implementing one or more embodiments of the invention.

The illustrative embodiments provide a method, system and computer program product for modeling variables in subprograms of HDL programs.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s), except that suffixes may be added, when appropriate, to differentiate such elements. Where a later figure utilizes the element in a different context or with different functionality, the element is provided a different leading numeral representative of the figure number (e.g., 147 in FIGS. 1 and 347 in FIG. 3). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. Specifically, as utilized herein, the term "HDL program" broadly refers to software products at least in part coded using one or more Hardware Description Languages.

With reference now to the figures, FIG. 1 depicts a block diagram representation of data processing system (DPS) 100, which is connected to network 180. In the described embodiments, network 180 includes a worldwide collection of networks and gateways (for example, servers) that utilize the Transmission Control Protocol/Internet Protocol (TCP/IP) suite of protocols to communicate with one another (illustratively, the Internet 182 and servers 184, 186 are shown). Connectivity of DPS 100 to network 180 may also be provided, for example, via a number of different types of networks (not shown), such as intranets, local area network (LANs), virtual private networks (VPNs), or wide area network (WANs) other than the Internet. In alternate embodiments, at least portions of DPS 100 may be embedded in servers 184, 186 or devices (not shown) in communication with these servers.

DPS 100 generally comprises at least one central processing unit (CPU) 105 and system memory 115 connected to CPU 105 via system bus 110. Herein DPS 100 is also illustrated with network interface device (NID) 150 (for example, modem). NID 150 is coupled to system bus 110 and, in operation, provides connectivity between DPS 100 and one or more access networks, such as the Internet 182.

Also connected to system bus 110 is I/O controller 120, which provides connectivity and control for input devices, of which pointing device (e.g., mouse) 121 and keyboard 123 are illustrated, and output devices, of which display 125 is illustrated. Additionally, multimedia drive 127 (e.g., CDRW or DVD drive) and USB (universal serial bus) hub 129 are illustrated. Multimedia drive 127 and USB hub 129 are coupled to I/O controller 120 and may be configured to operate as storage and input/output devices, respectively. Alternatively or additionally, some functions of the input and output devices may be executed remotely via NID 150.

System memory 115 includes, but is not limited to, cache memory, random access memory (RAM), read only memory (ROM), firmware memory devices, registers, and buffers, among other storage elements. Illustrated memory 115 contains a number of software/firmware components, including operating system (OS) 130, applications 135 (e.g., graphical user interface (GUI), networking applications, etc.), and HDL program 145 including a plurality of N subprograms $147_K$, where K is an integer and $1 \leq K \leq N$. In operation, OS 130 (e.g., Microsoft Windows®, GNU®/Linux®, or Advanced Interactive eXecutive® (AIX) operating system) supports execution and user interface features of application 135 and HDL program 145. In alternate embodiments, at least portions of OS 130, application 135, or HDL program 145 and some of subprograms 147 may reside on multimedia drive 127 or devices connected to servers 184, 186.

HDL program 145 is illustrated and described herein as a stand-alone (i.e., separate) software/firmware component, which is stored in system memory 115 and provides or supports the specific novel functions discussed below. In alternate embodiments, elements of applications 135 and at least portions of HDL program 145 or OS 130 may be combined in software modules incorporating functionality of their respective components.

In one illustrative embodiment, in HDL program 145, subprograms 147 facilitate simulation and modeling of temporal behaviour and/or spatial characteristics of circuit structure of electronic devices or components thereof. In particular, syntax of subprogram 147 allows modeling of sequential circuits and signal sampling procedures, among other modeling applications.

Among the software code/instructions provided by HDL program 145 and subprograms 147 and which are specific to the invention, are: (a) code for providing each subprogram 147 with an initial value of a variable parameter of a modeled element; (b) code for storing subprogram 147 containing the initial value of the variable parameter; (c) code for providing to HDL program 145 a copy of the stored subprogram 147 when the subprogram is called for execution; and (d) code for retaining the initial value of the variable parameter in the stored subprogram 147 during execution of the copy of the stored subprogram.

For simplicity of the description, the collective body of the code that enables these various features is referred to herein as HDL program 145 having subprograms 147. According to the illustrative embodiment, when CPU 110 executes HDL program 145 and subprograms 147, DPS 100 initiates a series of functional processes that enable the above functional features, as well as additional features/functionalities that are described below within the context of FIGS. 2 and 3.

Those of ordinary skill in the art will appreciate that hardware and software configurations depicted in FIG. 1 may vary. For example, other hardware or software components may be used in addition to or in place of the depicted components. The data processing system depicted in FIG. 1 may be, for example, a general purpose or specialized computer or workstation. Therefore, the architecture depicted in FIG. 1 is a basic illustration of a data processing system, which actual implementations may vary. Thus, the depicted example is not meant to imply architectural limitations with respect to the present invention.

Figure 2:
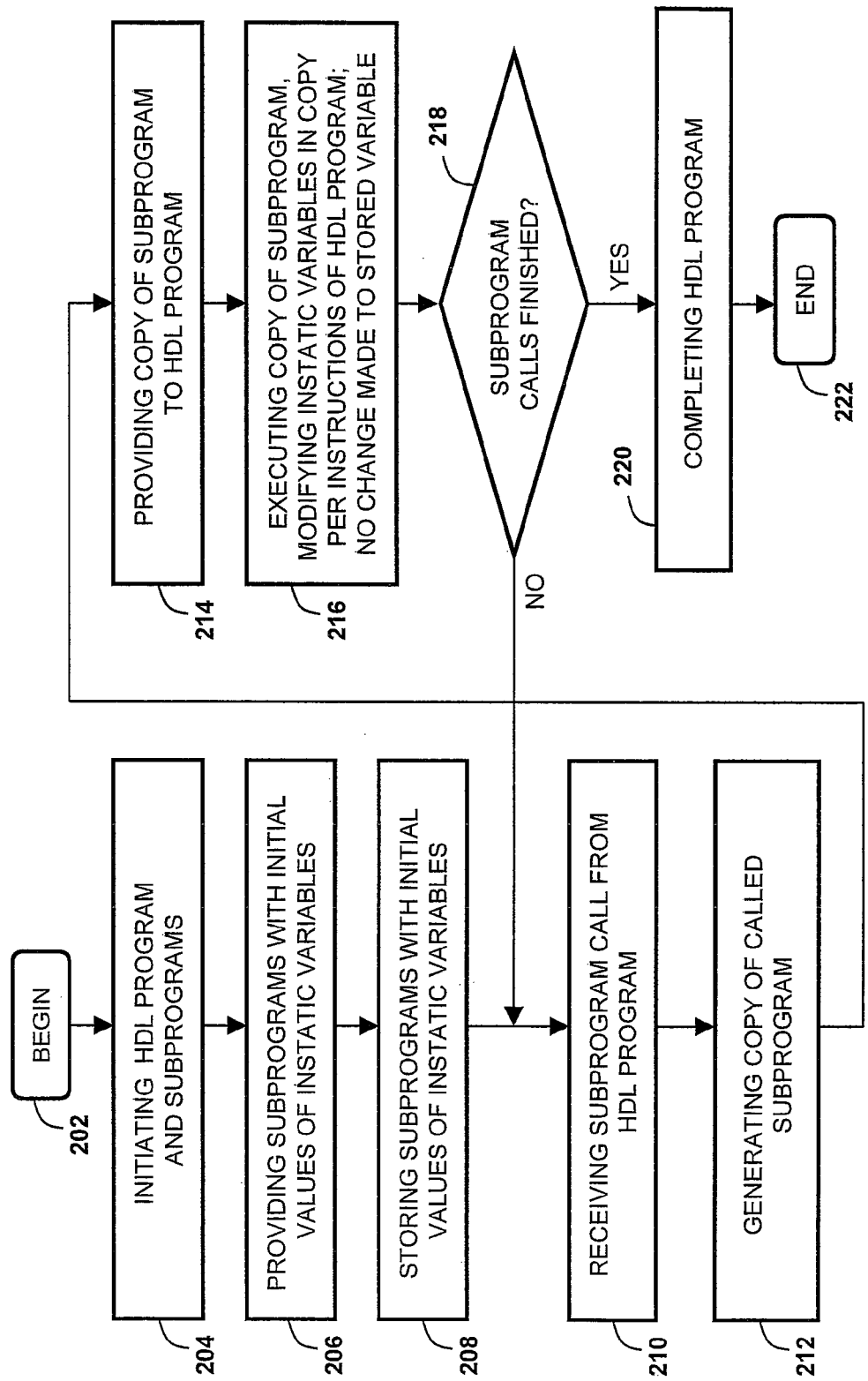
FIG. 2 is a flow chart of a process by which the features of the invention are implemented, according to one embodiment of the invention.
Figure 3:
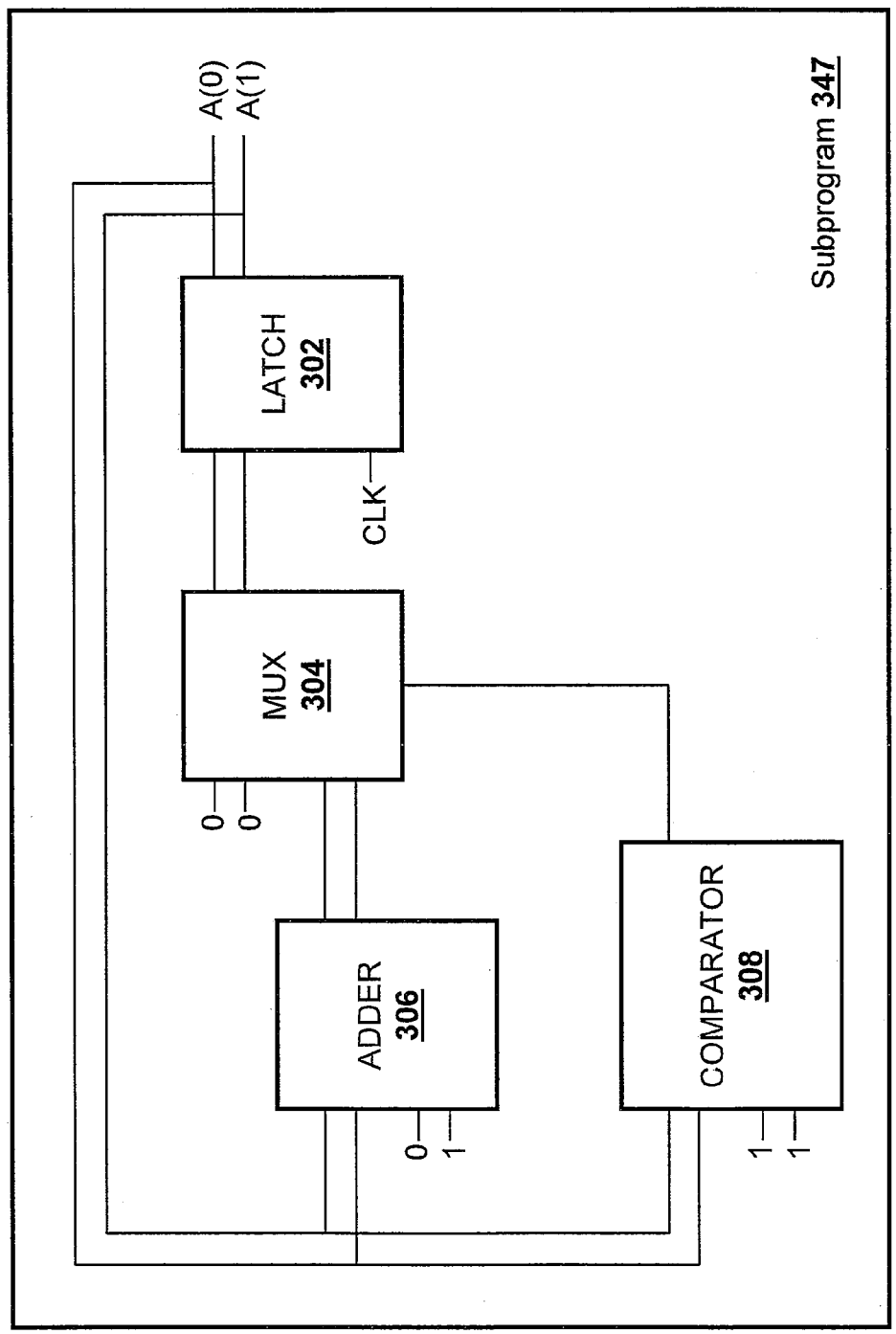
FIG. 3 illustrates a functional block diagram of a counter subprogram, in accordance with one embodiment of the invention.

With reference now to FIGS. 2 and 3, herein are described illustrative embodiments of the invention. FIG. 2 is a flow chart illustrating a process 200 by which methods of the illustrative embodiments are completed, and FIG. 3 illustrates a high-level block diagram of a counter subprogram 347, in which an embodiment of the invention is implemented. Although the features illustrated in FIGS. 2 and 3 may be described with reference to components shown in FIG. 1, it should be understood that this is merely for convenience and alternative components and/or configurations thereof can be employed when implementing embodiments of the invention.

Key portions of the process 200 may be completed by HDL program 145 executed in DPS 100 (FIG. 1) and controlling specific operations of/on DPS 100, therefore the process 200 is described below in the context of either/both HDL program 145 and DPS 100.

In the process 200, a property corresponding to a value of a variable parameter in a subprogram of HDL program performs as a new type of a variable, which is referred to herein as an "instatic variable". Correspondingly, a subprogram 147 containing at least one instatic variable or configured for calling other such subprograms is referred to as an "instatic subprogram". Hereafter, the terms "subprogram" and "instatic subprogram" are used interchangeably.

In contrast with static and dynamic variables commonly used in subprograms of HDL programs, the instatic variable remains static only during a subprogram call. In particular, every time a subprogram call is executed, the instatic variable keeps its value from the previous call to the same subprogram. However, if a subprogram call is embedded inside a loop construct, whether it is a "while", "for", or "repeat" statement, every iteration through the respective loop may be associated with a new value of the instatic variable property. For subprogram calls outside an iterative construct (e.g., loop, while loop, and the like), a call to an instatic subprogram is an equivalent to a per instance call, whereas for a subprogram call inside iterative constructs a per instance call is created for every subprogram call or iteration (e.g., for a subprogram call inside two loops each iterating 10 times, 100 of per instance calls are created).

These features of instatic variables prevent sharing data specific for the logic being modeled between different calls to the same subprogram, thus allowing modeling of sequential circuits in instatic subprograms of HDL programs. For example, instatic variables allow modeling of devices such as counters or edge detection logic, or modeling of iterative procedures such as sampling a signal every so many cycles, and the like. In event-driven HDL simulators, a different copy of an instatic subprogram is created per each subprogram call. Correspondingly, in synthesis or cycle-based simulations, the instatic variables are synthesized according to HDL latch inference algorithms.

The process 200 of FIG. 2 begins at block 202 and proceeds to block 204, at which HDL program 145 and instatic subprograms 147 are initiated. At block 206, instatic subprograms 147 are provided with initial values of their respective instatic variables of elements being modeled. The initial values of the instatic variables may be provided/entered using input devices of DPS 100 (i.e., mouse 121 and keyboard 123) or, alternatively, from a remote processor (not shown) via NID 150. At block 208, instatic subprograms 147 containing the initial values of the instatic variables are stored, e.g., in system memory 115 of DPS 100.

At block 210, HDL program 145 calls a particular instatic subprogram 147$_K$ for execution. At block 212, CPU 105 generates a copy of instatic subprogram 147$_K$. At block 214, the copy of instatic subprogram 147$_K$ is provided to HDL program 145, while the instatic subprogram itself and, specifically, the initial values of the respective instatic variables are retained unchanged in system memory 115.

At block 216, the copy of instatic subprogram 147$_K$ is executed by HDL program 145. During execution of instatic subprogram 147$_K$, inside of a loop construct, the initial value of the respective variable parameter in the provided copy of instatic subprogram 147$_K$ may be modified according to instructions of HDL program 145.

Block 218 is a decision block where process 200 queries if HDL program 145 finished all subprogram calls. If the query is negatively answered, the process 200 proceeds back to block 210, and blocks 210, 212, 214, and 216 are repeated for each of the remaining subprograms. If the query is positively answered, the process 200 proceeds to block 220 where HDL program 145 is completed, and, at block 222, the process 200 ends. During execution of non-instatic subprogram, blocks 206, 208, 212, 214, and 216 are omitted from the process.

In the flow chart in FIG. 2, one or more of the methods are embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

Referring to FIG. 3, instatic subprogram 347 for modeling a counter includes the following functional modules: latch 302, multiplexer (MUX) 304, adder 306, and comparator 308. Below is an example of a portion of an instatic VHDL subprogram for modeling the counter and a description of two calls to this subprogram:

```
function up_counter(countbits: positive; clk: std_ulogic) return
   std_ulogic_vector is variable instatic
   counter: std_ulogic_vector(0 to countbits −1);
begin
   if (clk ='1') then
      if (counter = 2**countbits−1) then
         counter :_ (others => '0');
      else
         counter := counter + 1;
      end if;
   end if;
   return counter;
end;
signal A: std_ulogic_vector(0 to 1);
signal B: std_ulogic_vector(0 to 2);
A <= up_counter(2);
B <= up_counter(3) when enable =      else (others => '0');
```

The up_counter function corresponds to a wrap around counter that jumps to the next value when the clk parameter is on. The above subprogram is synthesized for the signal A. A similar structure (not shown) may be synthesized for up_counter(3) producing the signal B.

Code of the subprogram may be further illustrated by the following commentaries:

```
function up_counter(countbits: positive; clk: std_ulogic) return
   std_ulogic_vector is variable instatic
   counter: std_ulogic_vector(0 to countbits −1);
--The up_counter function takes two parameters. The first parameter
countbits is a positive integer that represents the number of bits in the
counter. For countbits = 3, there is a 3-bits counter that counts from 0 to
((2 to the power 3) −1) = 7. The second parameter clk represents the clock
at which an output of the counter will update its value.
variable instatic counter: std_ulogic_vector(0 to countbits −1);
--The variable counter is declared to be instatic and a vector which size is
equal to the parameter countbits.
if (clk = '1') then
--When clk is enabled, the counter will be updated.
if (counter = 2**countbits−1) then
--If a current value of the counter is the highest value, then the counter
next value is zero, else the counter value is incremented by 1.
counter := (others => '0');
--The value of the counter in this branch is 0.
else
counter := counter + 1;
--In this branch, the value of the counter is incremented by 1.
return counter;
--The return value of the function is the value of the counter.
signal A: std_ulogic_vector(0 to 1);
signal B: std_ulogic_vector(0 to 2);
--A and B are two vectors which size is 2 and 3, respectively.
signal clk: std_ulogic;
--clk is the clock.
A <= up_counter(2,clk);
--A will be created as a two bits counter with clk as the clock of the
counter.
B <= up_counter(3,clk) when enable = '1' else (others => '0');
--B will be created as a multiplexer, which will be set to 0 when enable is
0, else it will be set to the value of a 3-bit counter.
```

In another example, the following instatic VHDL subprogram will describe two 3-bit counters having outputs C(0) and C(1):

```
type myary is array(0 to 1) of std_ulogic_vector(0 to 2);
signal clk: std_ulogic;
signal C: myary;
for i in 0 to 1 loop
   C(i) <= up_counter(3, clk);
end loop;
```

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for modeling a variable of an element in a Hardware Description Language (HDL) subprogram of a HDL program, the method comprising:
    providing the HDL subprogram with an initial value of the variable;
    storing the HDL subprogram containing the initial value of the variable;
    in response to a call to the HDL subprogram, executing, by a computer processor, the HDL subprogram by:
        providing to the HDL program a copy of the stored HDL subprogram comprising a copy of the variable, wherein the value of the copy of the variable is the initial value, and
        modifying, in the copy of the HDL subprogram, the value of the copy of the variable from the initial value to a second value, while the value of the variable in the stored HDL subprogram remains the initial value,
    wherein the initial value of the variable is retained in the stored HDL subprogram during and after execution of the copy of the stored HDL subprogram.

2. The method of claim 1, wherein the element is one of a sequential circuit, a circuit component, a property of a circuit component, and an iterative procedure.

3. The method of claim 2, wherein the element is a counter.

4. The method of claim 2, wherein the element is a signal sampling procedure.

5. A data processing system, comprising:
    a memory containing a code of a Hardware Description Language (HDL) program having a HDL subprogram in which an initial value of a variable of an element is stored; and
    a processor executing the code to:
    provide the HDL subprogram with an initial value of the variable,
    store in the memory the HDL subprogram containing the initial value of the variable,
    in response to a call to the subprogram, execute the subprogram by:
        providing a copy of the HDL subprogram for execution to the HDL program comprising a copy of the variable, wherein the value of the copy of the variable is the initial value, while the value of the variable in the stored HDL subprogram remains the initial value, and
        modifying, in the copy of the stored HDL subprogram, the value of the copy of the variable from the initial value to a second value,
    wherein the initial value of the variable is retained in the HDL subprogram in the memory during and after execution of the copy of the HDL subprogram.

6. The data processing system of claim 5, wherein the element is one of a sequential circuit, a circuit component, a property of a circuit component, and an iterative procedure.

7. The data processing system of claim 6, wherein the element is a counter.

8. The data processing system of claim 6, wherein the element is a signal sampling procedure.

9. A computer program product for modeling of a variable of an element in a Hardware Description Language (HDL) subprogram of a HDL program, said computer program product comprising a tangible computer readable storage device comprising:
    computer program code for providing the HDL subprogram with an initial value of a variable of the element;
    computer program code for storing the HDL subprogram containing the initial value of the variable;
    computer program code for, in response to a call to the subprogram, executing the subprogram by:
        providing to the HDL program a copy of the stored HDL subprogram comprising a copy of the variable, wherein the value of the copy of the variable is the initial value, and
        modifying, in the copy of the stored HDL subprogram, the value of the copy of the variable from the initial value to a second value, while the value of the variable in the stored HDL subprogram remains the initial value
    wherein the initial value of the variable is retained in the stored HDL subprogram during and after execution of the copy of the stored subprogram.

10. The computer program product of claim 9, wherein the element is one of a sequential circuit, a circuit component, a property of a circuit component, and an iterative procedure.

11. The computer program product of claim 10, wherein the element is a counter.

12. The computer program product of claim 10, wherein the element is a signal sampling procedure.

* * * * *